United States Patent
Blankenstein et al.

(10) Patent No.: US 8,580,072 B2
(45) Date of Patent: Nov. 12, 2013

(54) PROCESS FOR PRODUCING A DEVICE FOR THE INTAKE OR MANIPULATION OF A LIQUID

(75) Inventors: Gert Blankenstein, Dortmund (DE); Tobias Rodenfels, Dortmund (DE); Dirk Kurowski, Gevelsberg (DE); Mario Hempel, Dortmund (DE)

(73) Assignee: Boehringer Ingelheim microParts GmbH, Dortmund (DE)

( * ) Notice: Subject to any disclaimer, the term of this patent is extended or adjusted under 35 U.S.C. 154(b) by 870 days.

(21) Appl. No.: 12/519,293

(22) PCT Filed: Dec. 7, 2007

(86) PCT No.: PCT/EP2007/010656
§ 371 (c)(1),
(2), (4) Date: Jan. 25, 2010

(87) PCT Pub. No.: WO2008/071351
PCT Pub. Date: Jun. 19, 2008

(65) Prior Publication Data
US 2010/0126927 A1     May 27, 2010

(30) Foreign Application Priority Data

Dec. 14, 2006  (DE) .......................... 10 2006 059 459
Aug. 30, 2007  (DE) .......................... 10 2007 041 352

(51) Int. Cl.
B29C 65/02    (2006.01)
B29C 35/00    (2006.01)
B29C 51/00    (2006.01)
F15C 3/00     (2006.01)

(52) U.S. Cl.
USPC .................... 156/304.6; 156/304.1; 156/309.9

(58) Field of Classification Search
USPC ............. 156/304.1, 304.6, 306.3, 309.9, 311; 210/418; 137/561 R; 417/437
See application file for complete search history.

(56) References Cited

U.S. PATENT DOCUMENTS

| | | | |
|---|---|---|---|
| 4,950,354 A | 8/1990 | Schirmer | |
| 5,811,296 A | 9/1998 | Chemelli et al. | |
| 5,932,799 A | 8/1999 | Moles | |
| 6,565,532 B1 * | 5/2003 | Yuzhakov et al. | 604/142 |
| 6,729,352 B2 * | 5/2004 | O'Connor et al. | 137/827 |
| 6,902,706 B1 | 6/2005 | Colin et al. | |
| 7,318,912 B2 * | 1/2008 | Pezzuto et al. | 422/504 |
| 7,413,712 B2 | 8/2008 | Liu et al. | |
| 2006/0057030 A1 | 3/2006 | Lee et al. | |
| 2006/0076068 A1 | 4/2006 | Young et al. | |

FOREIGN PATENT DOCUMENTS

| | | |
|---|---|---|
| DE | 600 04 046 T2 | 4/2004 |
| JP | 6-327768 A | 11/1994 |
| JP | 2000-350780 A | 12/2000 |

(Continued)

*Primary Examiner* — John Kim
(74) *Attorney, Agent, or Firm* — Roberts Mlotkowski Safran & Cole, P.C.; David S. Safran

(57) ABSTRACT

A device for the intake or manipulation of a fluid, in particular, a liquid, and a method for the production of a device of this type in which a flat, non-preformed covering film is laminated onto a carrier, a three-dimensionally shaped or convex chamber wall being formed solely by means of the laminating process. The chamber wall which forms a boundary of a chamber for the fluid is partially deformable. The device is simple to produce and can be used universally.

26 Claims, 12 Drawing Sheets

(56) References Cited

FOREIGN PATENT DOCUMENTS

| JP | 2001-120658 A | 5/2001 |
| JP | 2002-340911 A | 11/2002 |
| WO | 02/068823 A1 | 9/2002 |
| WO | 2005/060432 A2 | 7/2005 |

* cited by examiner

PROCESS FOR PRODUCING A DEVICE FOR THE INTAKE OR MANIPULATION OF A LIQUID

BACKGROUND OF THE INVENTION

1. Field of Invention

The present invention relates to a device for the intake or manipulation of a fluid, such as a liquid, having a carrier, a cover film and a chamber formed between the carrier and the cover film, and a method of producing a device of this kind.

2. Description of Related Art

The present invention preferably relates to microfluidic systems or devices. The remarks that follow refer particularly to devices in which capillary forces come into play and are crucial to the operation, in particular.

Microfluidic devices are known having chambers, in particular, in the form of channels, which are at least partially delimited by a three-dimensionally shaped film, and in particular, are elastically deformable or compressible. Chambers or channels of this kind make it possible to take in and manipulate, more particularly convey, mix or deliver liquids.

U.S. Pat. No. 6,902,706 B1 discloses a valve for controlling a liquid in an analysis chip. The valve has a first and a second channel which emerge at a distance from one another on the top of a plate-shaped carrier. The openings at the exit end are covered by a film. To open the valve, the liquid is put under pressure so as to deform the film three-dimensionally and thus form a connection between the openings. There is nothing to indicate that the film is three-dimensionally preformed. Therefore, there is also nothing to indicate that the film is preformed three-dimensionally solely by the lamination process.

U.S. Patent Application Publication 2006/0076068 A1 discloses microfluidic structures consisting of substantially rigid membranes. In a plate-shaped substrate, open channels are arranged on a flat side. A first channel end and a second channel end are arranged at a distance from one another and are not joined together. The substrate is laminated with a film which has a region that is not connected to the substrate, and encompasses the first and second ends of the channel. When forces are applied to the film it deforms three-dimensionally and liquid flows from the first into the second channel. A film that has been three-dimensionally preformed by the lamination process is not disclosed.

U.S. Patent Application Publication 2006/00570303 A1 discloses a device for transporting liquid in bio-chips having a three-dimensionally shaped structure made of film. There is no indication that the three-dimensional shaping is achieved by laminating the film on.

International Patent Application Publication WO 02/068823 A1 discloses microfluidic control means which may be used as one-way valves. The valves are formed by a laminate of five layers. The laminate layers form an inlet channel with a valve seat, and an outlet channel which is separated from the inlet channel by a flexible membrane. The flexible membrane has an opening which is arranged against the valve seat. As substance flows in the inlet channel, the membrane is pressed against the valve seat towards the outlet channel and the opening is closed. When the flow is in the reverse direction, the membrane is deflected from the valve seat towards the inlet channel and the valve is opened. There are no references to membranes that have been preformed three-dimensionally by the lamination process alone.

International Patent Application Publication WO 2005/060432 A2 discloses a cassette for analysis purposes. A valve has a flexible material which is lifted away from a barrier at a certain pressure so as to form a passage. There is no disclosure of any flexible material which is three-dimensionally preformed solely by the lamination.

U.S. Pat. No. 4,950,354 relates to a method of producing an air-cushioned film. A heated thermoplastic film is drawn through the holes of a perforated substrate which has previously been laminated onto the film. The bubble-like structures formed are then closed by laminating another thermoplastic film onto the existing laminate.

SUMMARY OF THE INVENTION

An object of the present invention is to provide a device for the intake or manipulation of a fluid, especially a liquid, and a method for producing it, wherein an at least partially deformable, more particularly elastically deformable chamber or other three-dimensional structure bounded by a film can be produced in a particularly simple manner.

The above object is solved according to the present invention by a device of the initially mentioned type being provided with a flat or non-deformed cover film laminated onto a carrier, a chamber wall that is three-dimensionally shaped or domed being formed solely by the lamination process, and partially delimiting the chamber.

One aspect of the invention provides a flat and/or non-preformed cover film onto a carrier (i.e., by the action of heat and pressure) and to form, from the cover film, a three-dimensionally formed or domed chamber wall solely by the lamination process, the wall partially defining a desired chamber between the cover film and carrier. This allows a particularly simple manufacture.

In particular, for the lamination, a mask or so-called termode (heated die) with at least one recess or opening is pressed onto the cover film under the effect of heat so that, preferably, by this action alone the cover film is not connected to the carrier in the region of the recess or opening, but is three-dimensionally shaped or structured in this region. In the other regions, however, the cover film is preferably fixedly connected to the carrier by the lamination process in the usual way. Thus, the cover film can be structured or shaped very easily in order to form a three-dimensional structure, such as a chamber for a fluid, such as a liquid, particularly for the intake and/or manipulation thereof.

According to another aspect of the present invention which may also be realized independently, the cover film is at least partially covered by an additional film and/or in the region of a chamber formed by the cover film, while an additional chamber is formed between the cover film and the additional film. Particularly preferably, the additional film, like the cover film, is laminated on, while the additional film, in particular, solely as a result of the lamination process, in turn, forms a three-dimensionally shaped or convex additional wall which forms or partially limits the additional chamber. Thus, a universally usable three-dimensional structure can be obtained by a particularly simple method.

However, it is theoretically also possible to apply the cover film and/or additional film and/or deform it three-dimensionally by some other method.

According to an additional aspect of the present invention which can also be realized independently, the cover film or the chamber thus formed covers a membrane, so that in particular, any permeate passing through the membrane can be caught in the chamber and in particular, carried away from it through a linked channel or the like. Particularly preferably, the cover is joined to the membrane at its centre, particularly by lamination. Thus, a very high capillary force and hence very efficient separation or filtration can be achieved, most preferably in the separation of blood or the like.

By the term "chamber" is meant, according to the present invention, in particular, any three-dimensional structure—e.g., an elongate channel—which can be produced in the proposed manner or is bounded by the three-dimensionally shaped or structured cover film and which serves to hold liquid or some other fluid, optionally also gas. The same is also true of the term "additional chamber".

The present invention relates in particular, only to microfluidic devices or structures. The term "microfluidic" here denotes, in particular, only volumes of the whole device or chamber of not more than 100 µl, more preferably 10 µl or less.

Further advantages, features, properties and aspects of the present invention will become apparent from the following detailed description of some preferred embodiments with reference to the accompanying drawings.

DETAILED DESCRIPTION OF THE INVENTION

Figure 1:
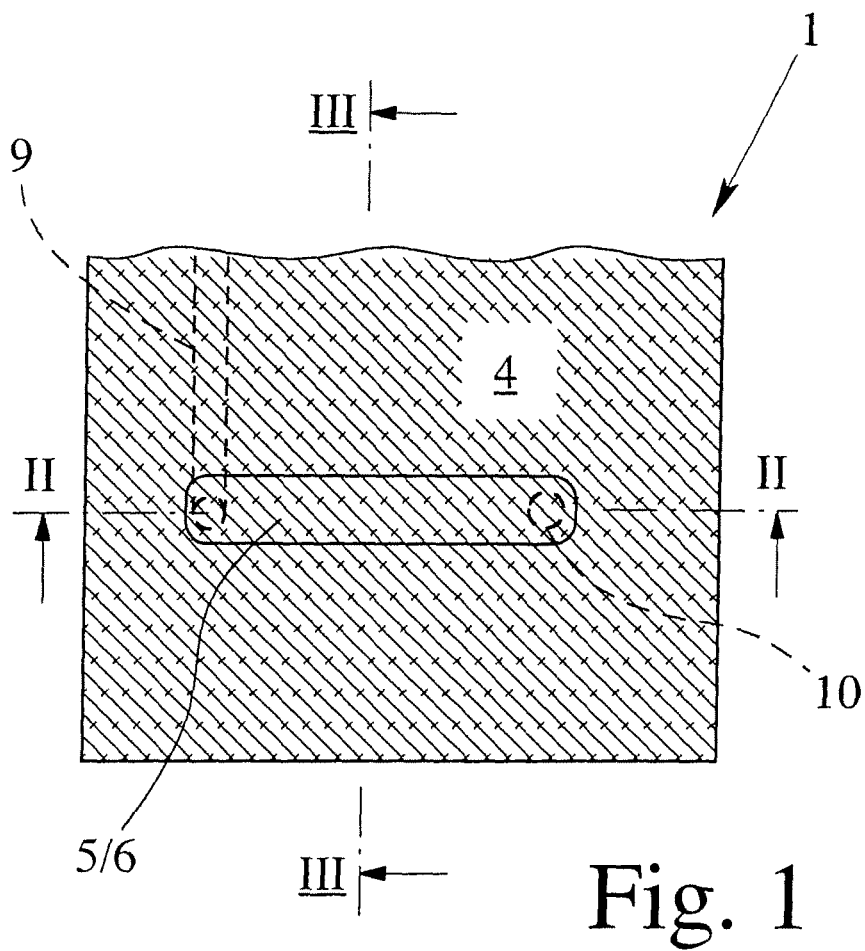
FIG. 1 is a plan view of a portion of a proposed device according to a first embodiment.

In the figures, the same reference numerals have been used for identical or similar parts where corresponding or comparable properties and advantages are achieved, even if the relevant description has not been repeated. The figures are not to scale, in order to illustrate various aspects and simplify the description.

FIG. 1 shows, in a schematic plan view of a portion of a proposed device 1 for the intake and/or manipulation of a fluid, particularly a liquid. The fluid or liquid is not shown in FIG. 1. Rather, the schematic section according to FIG. 2 taken along line II-II in FIG. 1 shows the device 1 with the liquid 2 by way of example.

The device 1 comprises a carrier 3 and a cover film 4. Between the carrier 3 and the cover film 4 is formed a three-dimensional fluidic structure for the intake or manipulation of the fluid. In particular, the structure is a preferably a channel-shaped chamber 5.

The structure or chamber 5 is at least partially bounded by a chamber wall 6 which is formed in or by the cover film 4. In particular, the carrier 3 is of flat or planar construction, at least in this area, with the exception of any inlets or outlets for the fluid, so that the structure or chamber 5 is formed essentially or virtually exclusively outside of the carrier 3, or above the flat side F thereof, in the cover film 4.

The cover film 4 is laminated onto the carrier 3, particularly the flat side F of the carrier 3, i.e., attached to the carrier 3 under the action of pressure and heat (particularly at about 80-100° C.).

Before the lamination process, as proposed, the flat cover film 4 is neither preformed nor three-dimensionally structured or the like, in order to form the three-dimensionally shaped and/or domed chamber wall 6. Rather, the cover film 4 is only deformed, structured and/or prestressed by the lamination process so as to form the three-dimensionally shaped or convex chamber wall 6, more particularly to curve or deform it away from the carrier 3, and/or in particular, without the application of any pressure, such as gas pressure applied to the chamber wall 6.

Figure 3:
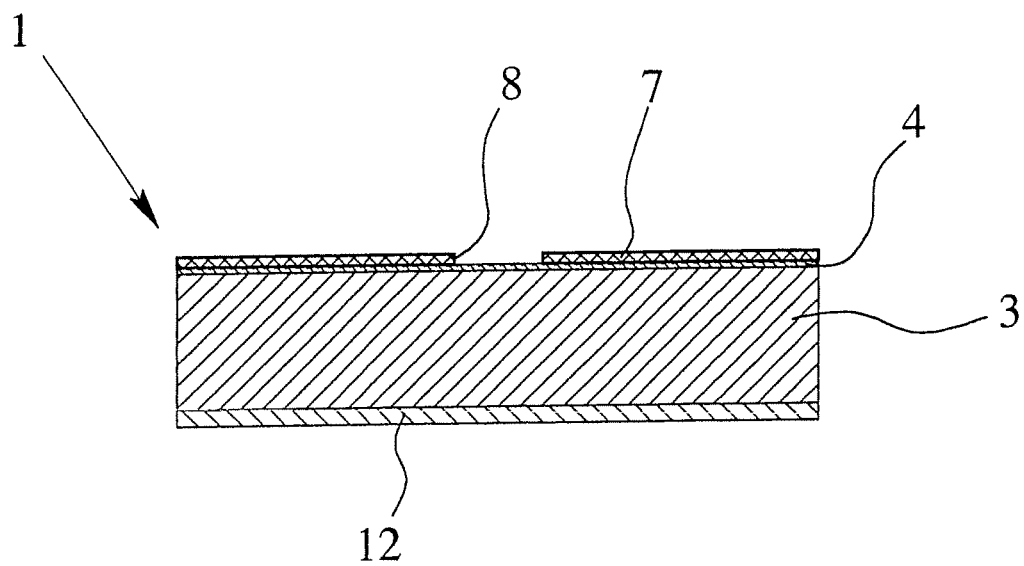
FIG. 3 is a schematic section taken along line III-III in FIG. 1, in which lamination has not yet taken place.

The schematic section according to FIG. 3 shows the initially smooth or flat cover film 4 on the carrier 3 before the lamination process, i.e., before the chamber 5 is formed.

According to the proposal, the lamination is carried out, in particular, with a so-called termode or mask 7, which is formed, for example, by a correspondingly formed punch, intermediate layer or the like. If desired, the mask 7 may also be formed by the surface of a roll or roller of a roller laminator or the like.

Figure 5:
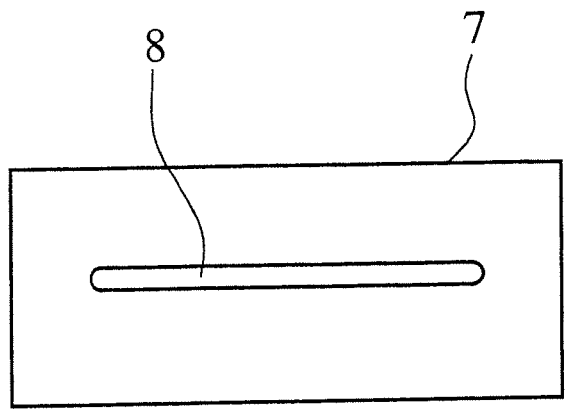
FIG. 5 is a schematic plan view of a mask or termode indicated in FIG. 3.

The mask 7 here has at least one recess or opening 8, as shown in FIG. 3, and in the view from below in FIG. 5.

Figure 4:
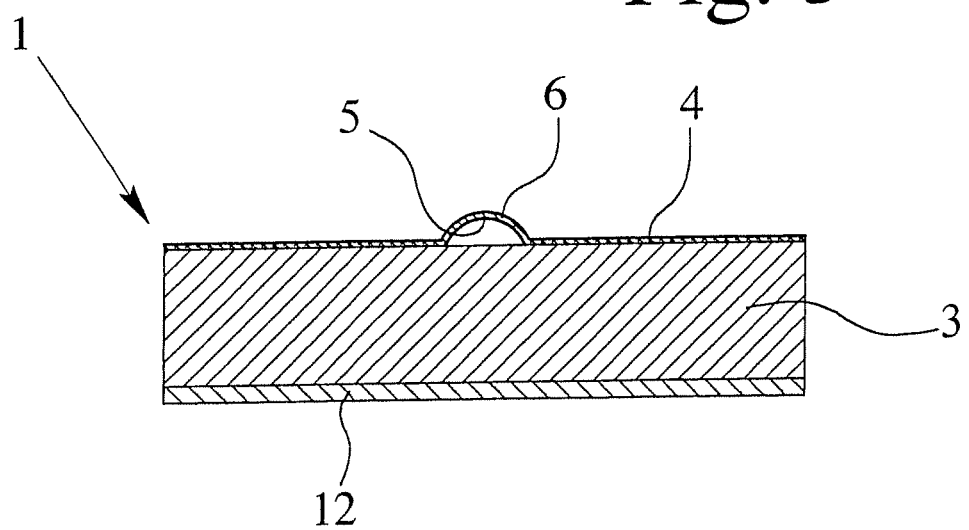
FIG. 4 is a schematic section corresponding to FIG. 3 after the lamination process.

For the lamination, the mask 7 is pressed, under the action of heat, onto the cover film 4 which is, in particular, lying loosely on the carrier 3 to begin with. In this way, the cover film 4 is preferably not attached to the carrier 3 exclusively in the region of the recess or opening 8 but in this region is three-dimensionally shaped or structured as shown in FIG. 4. Surprisingly, in fact, it has been shown that without any additional deformation step, and in particular, without the use of a blowing agent, pressurized gas or the like, the cover film 4 is made convex in the region of the recess or opening 8 in the mask 7, thus forming the three-dimensionally shaped or convex chamber wall 6, as shown schematically in FIG. 4.

The proposed three-dimensional deformation of the cover film 4 may, in particular, be carried out selectively with a punch laminator or roller laminator (not shown), as desired.

The proposed lamination is, in particular, very easy to do as there is no need for any additional deformation steps. The mask 7 is very easy to manufacture since there is no need for any three-dimensional structuring of the mask 7. Rather, it is sufficient to form an opening 8 or plurality of openings 8 with the desired contours.

Figure 2:
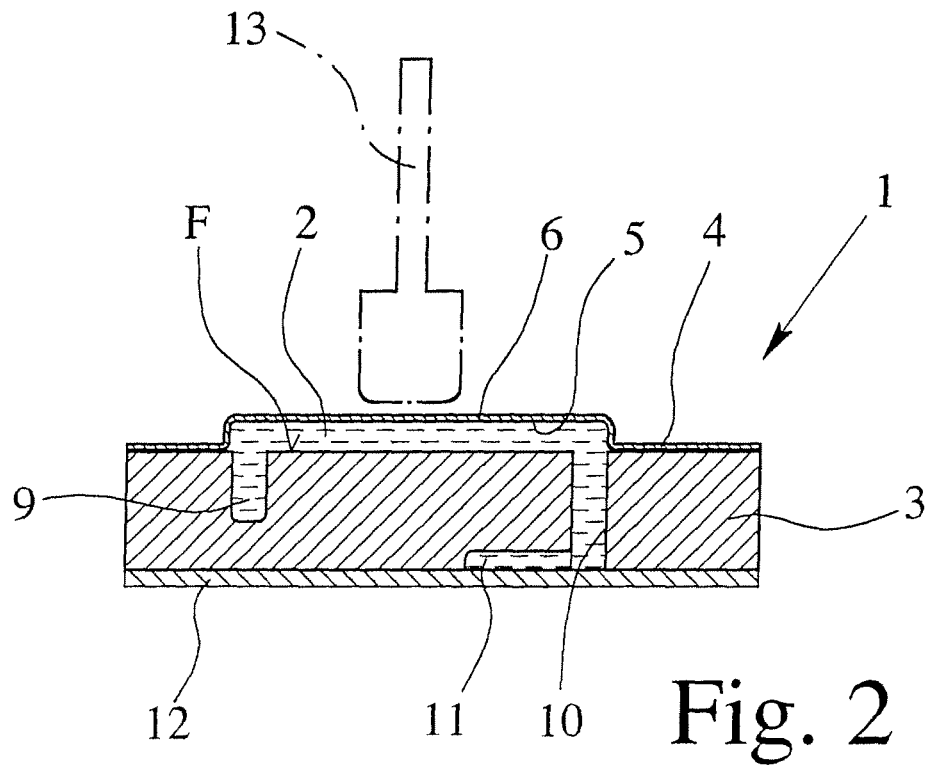
FIG. 2 is a schematic section taken along line II-II in FIG. 1.

In this first embodiment, the chamber 5 is essentially channel-shaped or of elongate and/or bead-shaped construction, as shown in the plan view according to FIG. 1 and in section in FIG. 2. At right angles thereto, the chamber 5 is preferably relatively thin, and in particular, is substantially semicircular in cross-section, as shown in the section in FIG. 4 which is at right angles to FIG. 2. In particular, the chamber wall 6 formed by the cover film 4 is of a convex or half-round construction at right angles to the longitudinal extent of the chamber 5. However, other configurations, shapes and structures are also theoretically possible.

The structure or chamber 5 formed in the cover film 4 as proposed is fluidically connected, for example, to a first channel 9 and/or a second channel 10 of the device 1 or carrier 3 or other fluidic structure, fluidic component or the like. In this embodiment, the first channel 9 runs along the flat side F. It is formed, for example, by a groove in the carrier 3, which is flatly covered, in particular, by the cover film 4. The first channel 9 ends or begins with one end, for example, at an end region of the chamber 5.

As shown in FIG. 2, the second channel 10 adjoins the other end of the chamber 5, in particular. For example, the second channel 10 is constructed as an opening or bore through the carrier 3 and fluidically connects the chamber 5 to a fluidic structure 11, such as a channel, a detection area, a mixing area or the like arranged on the other flat side of the carrier 3.

The structure 11 is preferably also formed in the carrier 3 and is covered, for example, by a cover 12 which, in turn, may be a cover film which is, in particular, made of the same material as the upper cover film 4.

The proposed device 1 forms, in particular, a microfluidic platform or a microfluidic system for the intake or manipulation of a fluid, such as the liquid 2.

In particular, the chamber 5 or the chamber wall 6 is elastically or reversibly deformable. It may be restored, for example, by the application of corresponding restoring forces to the cover film 4 or chamber wall 6 and/or by the fluid pressure prevailing in the chamber 5.

For the deformation, a part or element 13, schematically shown in FIG. 2, for example, such as a punch, a roll, a roller, a slide, some other actuator or the like, may act on the chamber wall 6. The element 13 is movable, for example, at right angles to the longitudinal extent of the chamber 5 or to the flat side F or planar surface of the carrier 3, so that the chamber wall 6 can be pressed onto the carrier 3 in the region of the element 13 and in this way, a fluidic flow through the chamber 5 can be interrupted or stopped or throttled, more particularly, controlled or regulated as if by a pinch valve.

Particularly, where the chamber 5 is of elongate construction, the element 13 may, for example, also be moved in the longitudinal direction along the chamber 5 with local compression of the chamber 5, thus allowing the fluid 2 to be conveyed or displaced in the chamber 5 in the manner of a peristaltic pump. In this case, the chamber 5 thus forms a deformable pump chamber.

In the two examples mentioned hereinbefore, the transverse extent of the area of the element 13 acting on the chamber 5 or chamber wall 6 is preferably substantially at least as great as the width of the chamber 5 at right angles to its longitudinal extent. However, the element 13 may also be relatively narrow or small in construction relative to this width. In this case, in particular, the element 13 is especially suitable for moving the fluid in the chamber 5, for example, back and forth, or if the chamber 5 is correspondingly designed, in a circle or around a circuit, for example, in order to mix, e.g., different fluids or a dispersion. In this case, the chamber 5 thus forms a mixing chamber, in particular.

It is noted that the device 1, constructed as proposed, may be used for all kinds of purposes, e.g., for controlled ventilation or aeration, in particular, and may also be combined with other, in particular, microfluidic systems, components, such as valves, pumps, capillary stops, filters, detecting devices or the like.

The proposed device 1 may also be used, for example, for the analysis or other treatment or manipulation of fluids such as the liquid 2.

In the embodiments shown, the carrier 3 is preferably made of plastics, in particular, polystyrene or polycarbonate.

The carrier 3 is preferably at least substantially plate-shaped, flat and/or planar in construction.

Preferably, the carrier 3 is at least substantially rigid in construction. In particular, the carrier 3 or its surface is formed from a material which is more temperature-resistant than the cover film 4 or a heat-sealing coating on the cover film 4.

The cover film 4 is preferably made of plastics, especially polyethylene or polypropylene. The cover film 4 is transparent or opaque in design, possible only in parts, and is of a single-layered or multi-layered construction, as desired. This depends on its intended applications and requirements. In particular, the cover film 4 is a so-called heat-sealing film which usually has a coating of sealing lacquer or the like.

Depending on the particular needs, the cover film 4 may also form a plurality of three-dimensionally shaped or convex chamber walls 6 of different chambers 5.

As already mentioned, the cover film 4 may also cover or form some other fluidic structure or all the other fluidic structures in or on the carrier 3, such as a recess, a depression, an opening, a groove or the first channel 9 and/or a plurality of chambers 5 or the like.

Some additional embodiments and alternative features of the proposed device 1 will now be described with reference to the other figures. To avoid repetition, only essential differences will be described, in particular, so that the remarks and explanations provided hitherto will still apply in corresponding or supplementary fashion.

Figure 6:
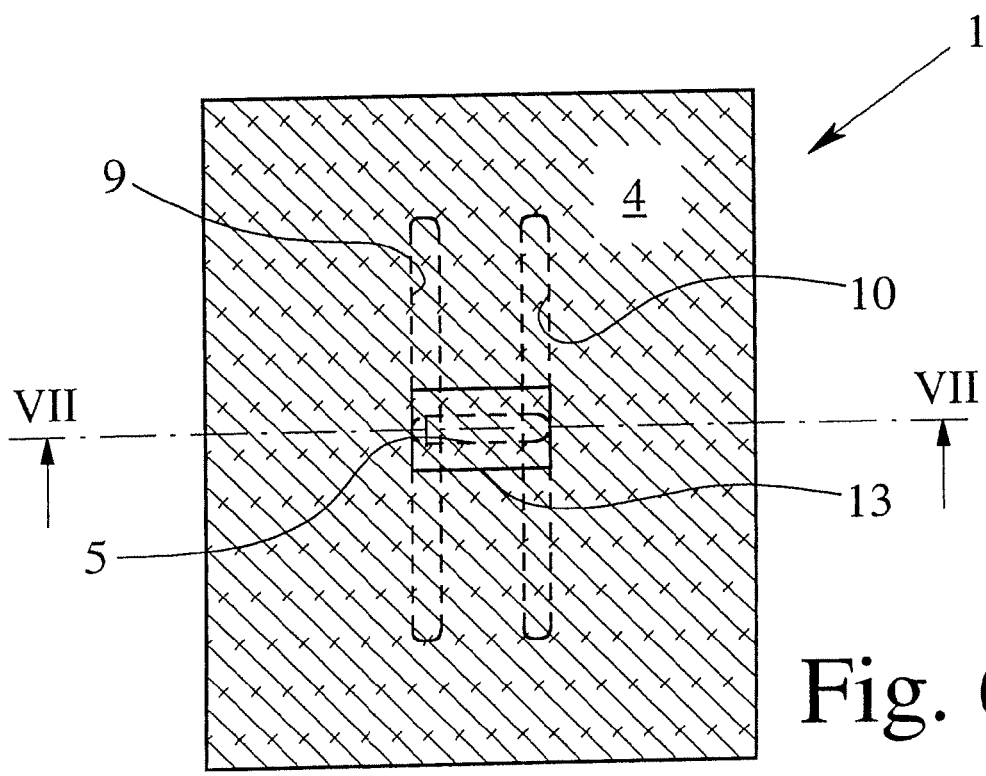
FIG. 6 is a schematic plan view of a proposed device according to a second embodiment.

FIG. 6 shows a plan view of a second embodiment of the proposed device 1. The first and second channels 9, 10 extend in a plane and/or at least substantially parallel to one another. The two channels 9, 10 are joined together or are adapted to be joined together by the chamber 5 formed by the cover film 4.

Figure 7:
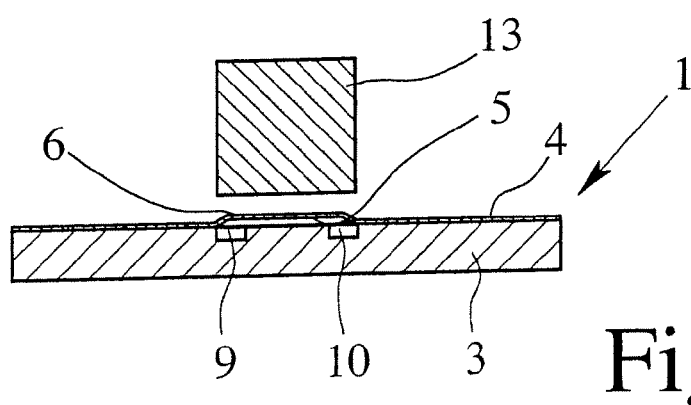
FIG. 7 is a schematic section taken along the line VII-VII in FIG. 6.

FIG. 6 shows the device with the element 13 arranged above the chamber 5. FIG. 7 shows a schematic section through the device 1 in FIG. 6 along the line VII-VII. Here, the element 13 is still raised. In this case, the fluidic connection between the two channels 9, 10 through the chamber 5 is open, in particularly the chamber wall 6 is curved upwardly or raised from the flat side F of the carrier 3.

Figure 8:
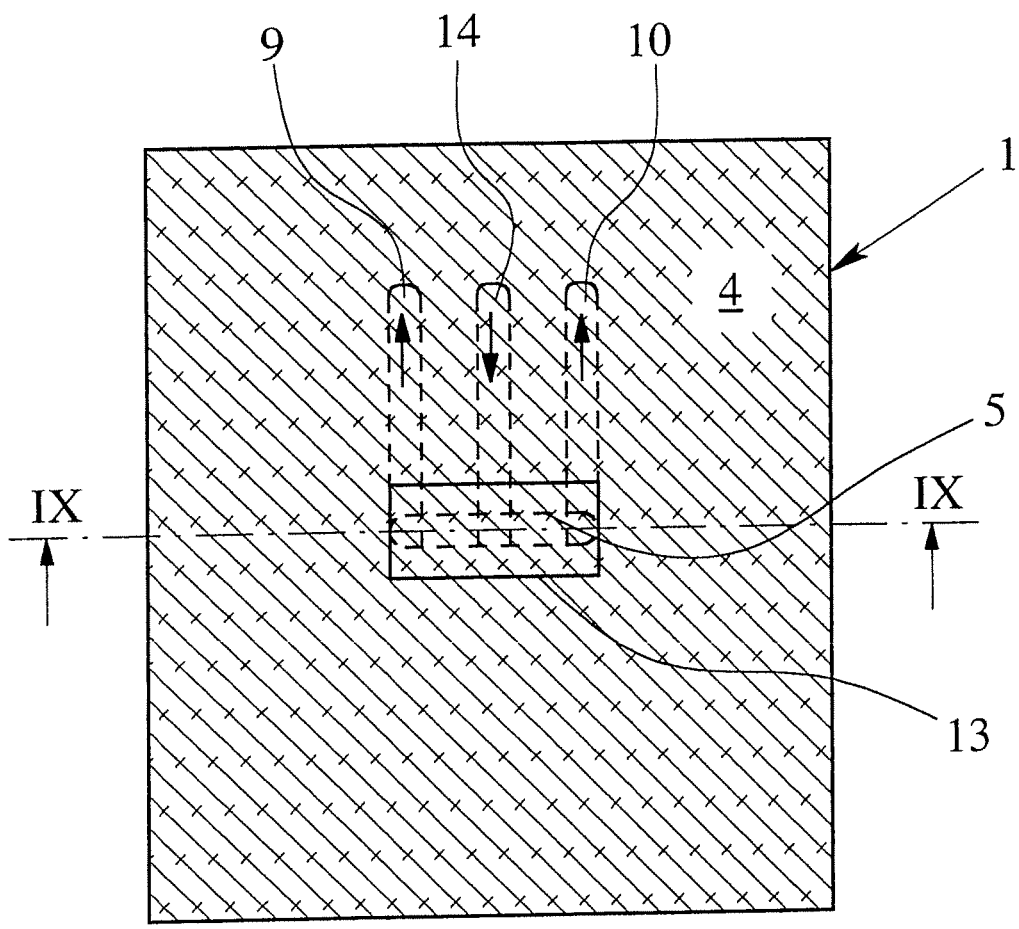
FIG. 8 is a schematic plan view of a proposed device according to a third embodiment.

FIG. 8 shows in a schematic plan view a third embodiment of the proposed device 1 which is very similar to the second embodiment. A third channel 14 is additionally provided. The third channel 14 serves for example, to supply a fluid such as a washing liquid or the like. The third channel 14 is connected or adapted to be connected to the other two channels 9, 10 via the chamber 5. FIG. 8 shows the state with the connection in place. The arrows indicate possible directions of flow. The liquid supplied through the channel 14 is discharged again for example, through the other two channels 9, 10.

In the third embodiment shown, the fluidic connection to the two externally situated channels 9, 10 is preferably adapted to be simultaneously closed off or opened up or throttled. For this purpose, the associated element 13 for controlling the fluidic connection is correspondingly wide or long in construction. Depending on the squeezing or deformation of the chamber wall 6, which is domed in the uninterrupted state, the fluidic connection can be throttled to a greater or lesser extent or finally interrupted altogether.

Figure 9:
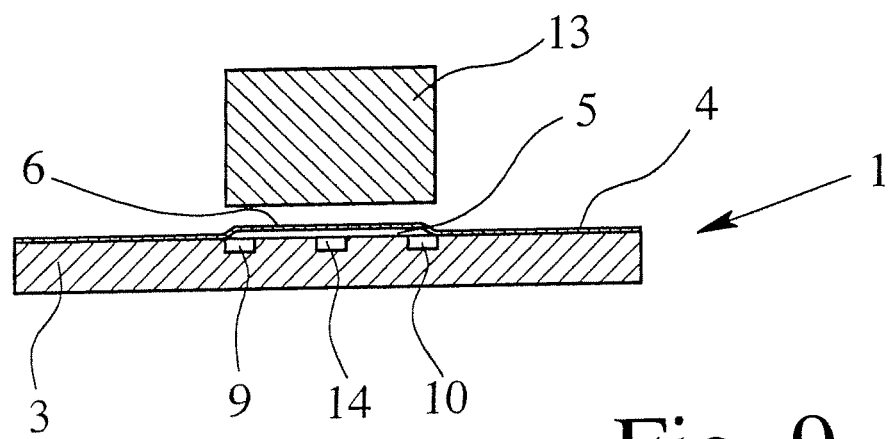
FIG. 9 is a schematic section taken along line VIII-VIII in FIG. 8.

The schematic section according to FIG. 9 along the line VIII-VIII in FIG. 8 illustrates a possible, relatively wide construction of the element 13. The element 13 extends in particular, as far as or even over the two channels 9, 10 provided at the edges—more precisely over their connections to the chamber 5. However, other design solutions are also possible.

In particular, it is also possible for the fluidic connection from the third channel 14 to the channel 9, on the one hand, and to the channel 10, on the other hand, to be independently controllable. In this case, in particular, two separate or independently controllable or actuatable elements 13 are associated with the chamber 5. However, this effect may also be achieved, with corresponding displacement, rotation of the chamber or the like, with only a single element such as the element 13 shown or another element 13, if desired.

It is noted that depending on the compression of the chamber 5 it is also possible to achieve throttling of the fluidic connection. The proposed device 1 may thus be used, in particular, not only as a valve, but also as a throttle or other element for fluidic manipulation.

For example, the device 1 may also be used for controlled ventilation and/or aeration. In this case, there may be virtually indirect control of an associated liquid or the like, in particular. As in the first embodiment, the channels 8, 9, 14 in the second and third embodiments are preferably formed by recesses, grooves or the like in the carrier 3 and preferably covered by the cover film 4. However, other design solutions are also possible. In particular, the channels 9, 10 and/or 14 may also be formed, defined, guided or connected by means of bores, tubes, other covering elements or carriers or the like.

Figure 10:
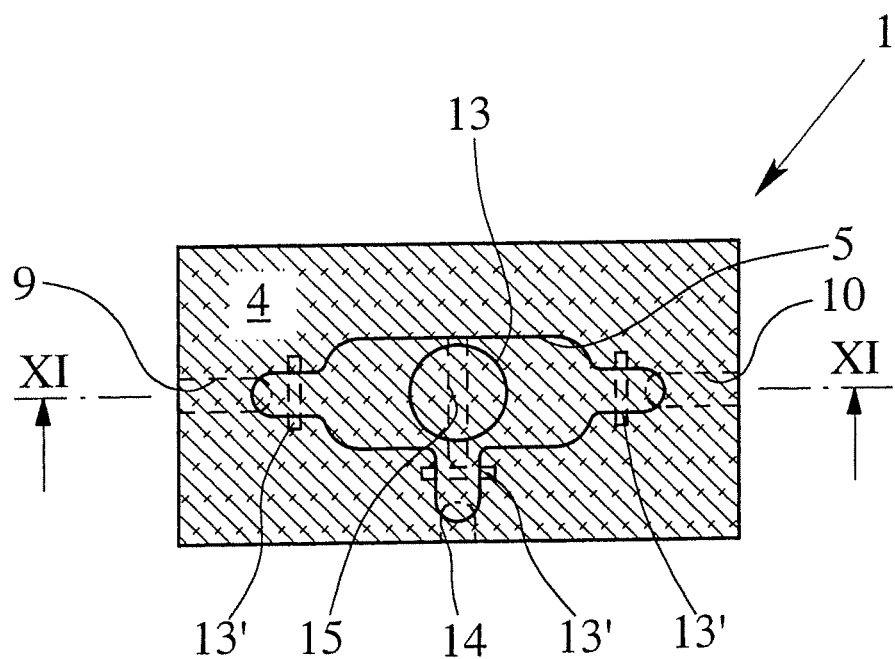
FIG. 10 is a schematic plan view of a proposed device according to a fourth embodiment.

FIG. 10 shows in a schematic plan view a fourth embodiment of the proposed device 1. Here, the chamber 5 forms a mixing chamber, in particular. Different liquids or other fluids may be supplied through the two channels 9, 10, which are opposite each other, in particular. In the chamber 5, a stopping structure, particularly a capillary stop structure 15, is preferably formed by a transversely extending groove, an elevation, a hydrophobic region, a hydrophilic region or the like. The third channel 14, which is preferably attached to the mixing chamber via a capillary stop, serves to remove air from the chamber 5, in particular.

After the filling of the chamber 5, the channels 9, 10 and optionally also 14 preferably can be closed off fluidically by valves or other means, particularly preferably by squeezing using additional elements 13', as indicated by dashed lines only in FIG. 10. Then, the element 13 is pressed onto the convex chamber wall 6 and moved particularly in a circular movement and/or back and forth in a linear movement. Thus, the liquids contained in the chamber 5 can be mixed by pressing in or deforming the chamber wall 5 only at certain points, in particular.

After the defined mixing and opening of at least one fluidic connection the liquids may be transported onwards or expelled again by squeezing the chamber 5, for example.

Figure 11:
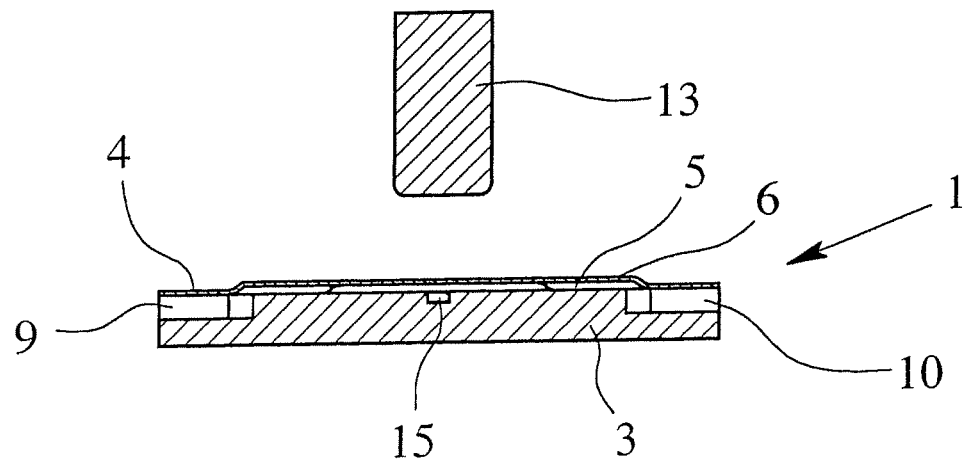
FIG. 11 is a schematic section taken along line XI-XI in FIG. 10.

FIG. 11 shows, in a schematic section along the line XI-XI in FIG. 10, the device 1 with the element 13 lifted off.

Figure 12:
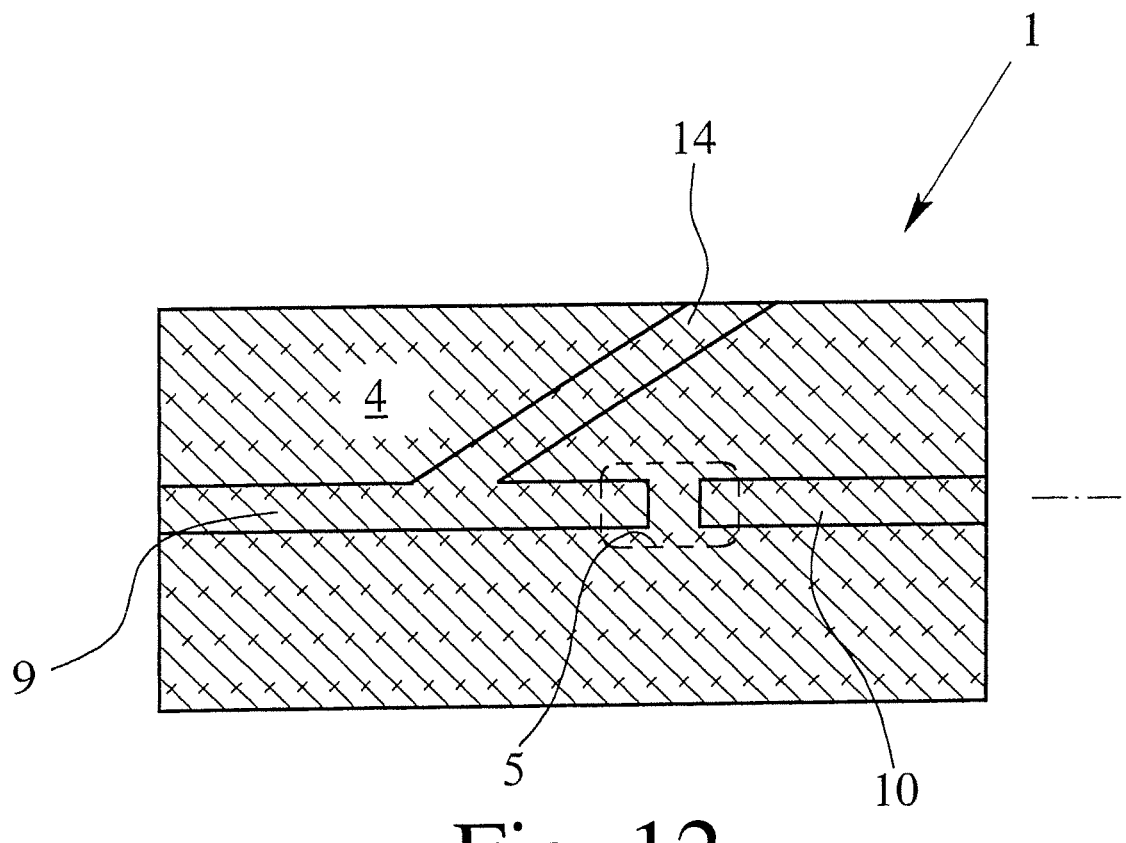
FIG. 12 is a plan view of a detail of a proposed device according to a fifth embodiment.

FIG. 12 shows a schematic plan view of a fifth embodiment of the proposed device 1. Here, the chamber 5 formed by the cover film 4 is preferably arranged between the first channel 9 and the second channel 10 or connects these two channels. The first channel 9 has a branch upstream of the chamber 5 to the adjoining third channel 14.

When a fluid, such as a liquid containing cells or the like, is supplied to the first channel 9, the deformable or closable chamber 5 can be used to control selectively or deliberately whether the fluid and the cells or the like flow through the chamber 5 into the second channel 10 or, with corresponding blocking or throttling (squeezing of the chamber 5), are conveyed onwards through the branch into the third channel 14. In this way, a cell sorter can be produced, for example. However, this arrangement may also be used for other purposes in fluidics, particularly in microfluidics.

Figure 13:
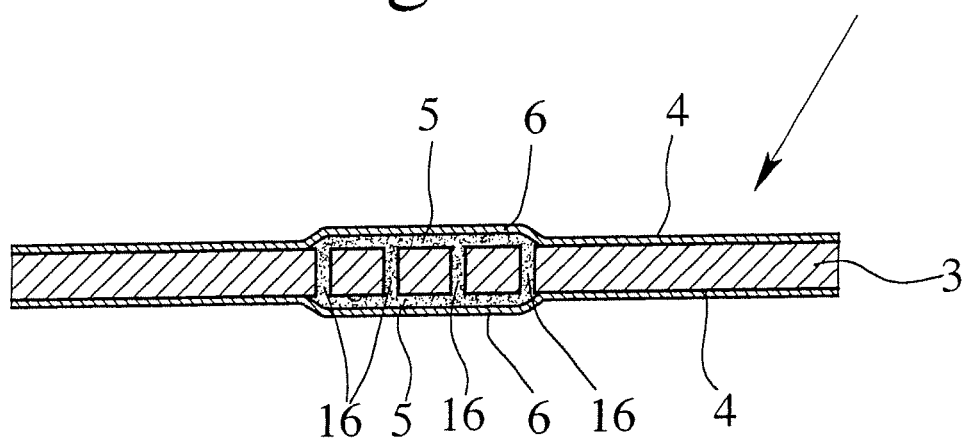
FIG. 13 is a schematic section of a proposed device according to a sixth embodiment.

FIG. 13 shows a schematic section through a sixth embodiment of the proposed device 1. Here, a chamber 5 is formed by a cover film 4—preferably applied by lamination as already described—on two opposite sides, particularly flat sides, of the carrier 3. The two chambers 5 arranged opposite each other and/or on sides of the carrier 3 facing away from one another are preferably directly connected to one another by openings, pores, bores, channels 16 or the like in the carrier 3. By suitable, particularly alternate deformation or squeezing of the chambers 5 or the chamber walls 6, thereof, it is possible to allow fluid contained in the chambers 5 to flow alternately from one chamber 5 into the other chamber 5 and vice versa. This helps, in particular, to ensure thorough mixing of liquids, reaction with a reagent which is present on or in the carrier 3, for example, or the like.

Figure 14:
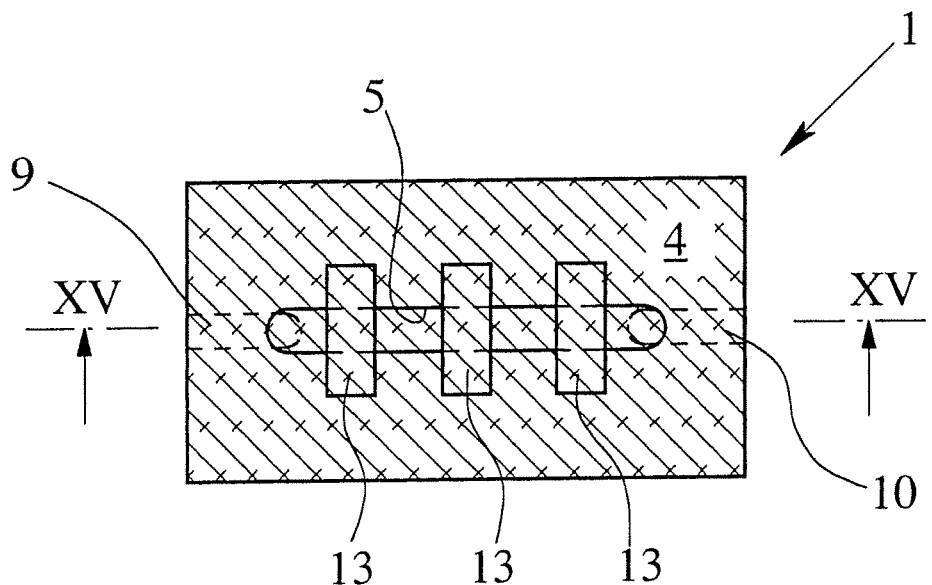
FIG. 14 is a schematic plan view of a proposed device according to a seventh embodiment.
Figure 15:
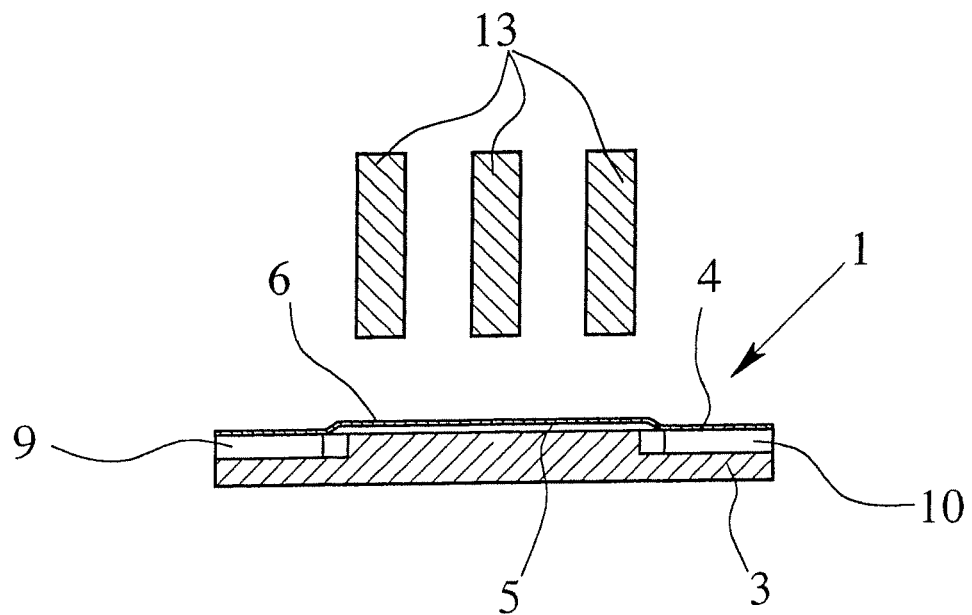
FIG. 15 is a schematic section taken along line XV-XV in FIG. 14.

FIG. 14 shows in a schematic plan view a seventh embodiment of the proposed device 1. FIG. 15 shows a schematic section on the line XV-XV in FIG. 14. In the seventh embodiment, the chamber 5 is of elongate construction. Associated with the chamber 5 there is preferably a plurality of elements 13, particularly three or more elements, which can be depressed or actuated one after another or in a specific sequence. In this way, it is possible to produce a microfluidic pump without the elements 13 having to move in the direction of pumping, i.e., along the chamber 5. Rather, the coordinated movement at right angles or perpendicularly to the flat side of the carrier 3 or to the longitudinal extent of the chamber 5 is sufficient to produce a net flow of the fluid, e.g., out of the first channel 9 into the chamber 5 and on into the second channel 10, by corresponding compression of the chambers 5 one after another.

Figure 16:
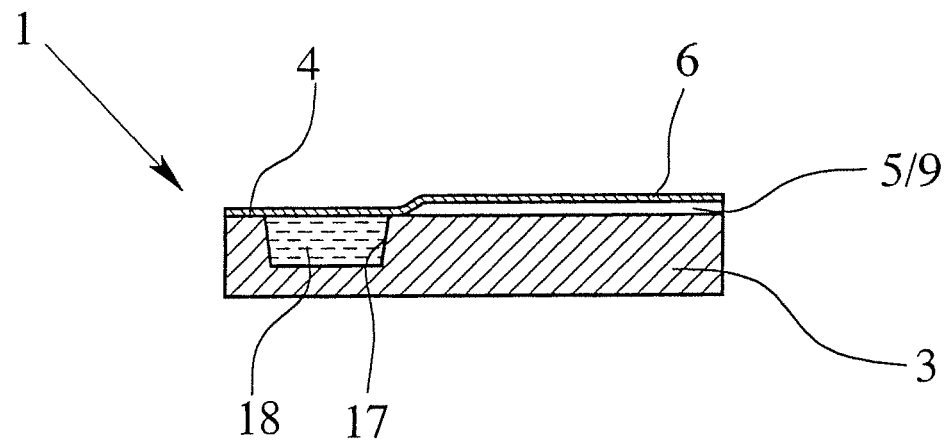
FIG. 16 is a schematic section of a proposed device according to an eighth embodiment.

FIG. 16 shows, in schematic section, an eighth embodiment of the device 1 according to the invention. The important point here is that the cover film 3 which has already been applied by lamination has to be modified or acted upon by the action of heat and pressure in a first region such that the cover film 4 becomes detached again from the associated carrier 3 in a second region adjacent to the first region and in particular, is three-dimensionally deformed or domed. FIG. 16 shows the state of the cover film 4 which has already been laminated on, covering a recess 17 in the carrier 3 and adjacent regions of the surface. Here, the recess 17 is filled with a substance 18 by way of example.

Figure 17:
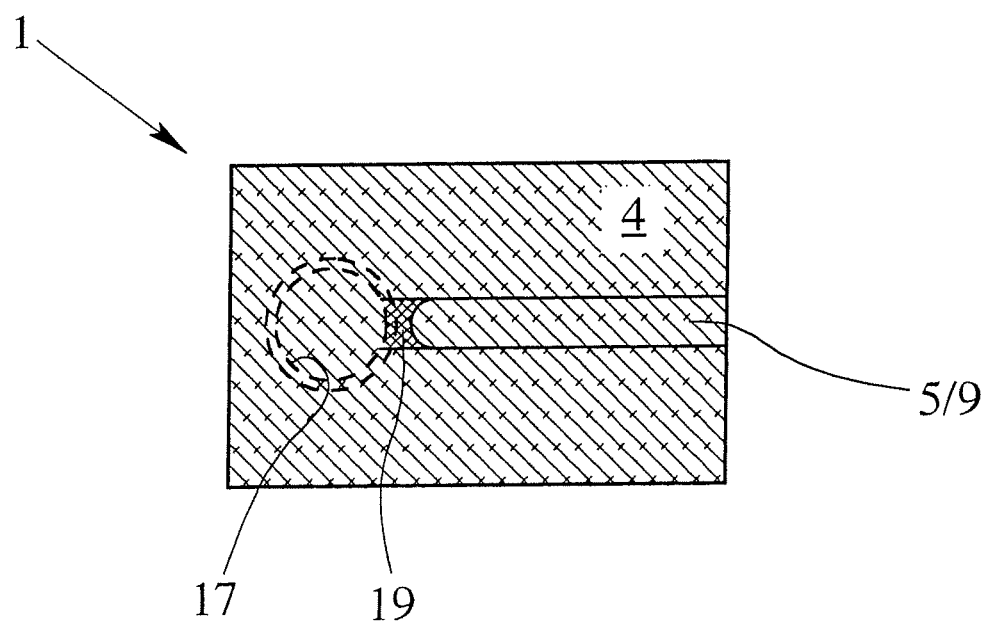
FIG. 17 is a schematic plan view of the device according to FIG. 16.

It is apparent from the schematic plan view in FIG. 17 that, for example, a preformed channel 9 already extends close to the recess 17, but is fluidically separated from the recess 17 by a laminated-on region 19 of the cover film 4 shown by broken lines in FIG. 17.

Figure 18:
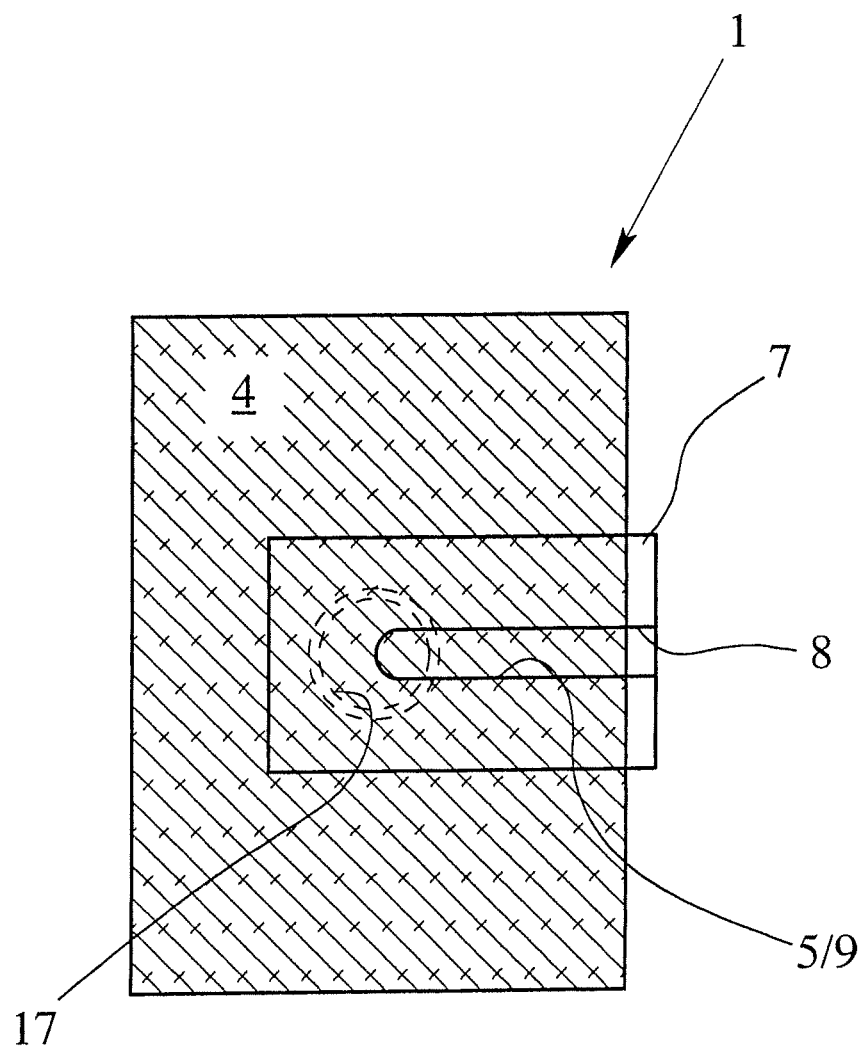
FIG. 18 is a schematic plan view of the device according to FIG. 16 during the opening of a channel.

By applying a correspondingly shaped mask 7 with a recess or opening 8 in the specified region 19 it is possible to re-detach the cover film 4 from the carrier 3 and in particular, to shape it three-dimensionally or make it convex in the region 19 by the action of heat and pressure in the adjacent lateral region. Thus, a fluidic connection is made between the recess 17 and the channel 9 or to the substance 18. FIG. 18 illustrates the state when the mask 7 or so-called termode or the like has been put on and the fluidic connection to the recess 17 has already been made.

Figure 19:
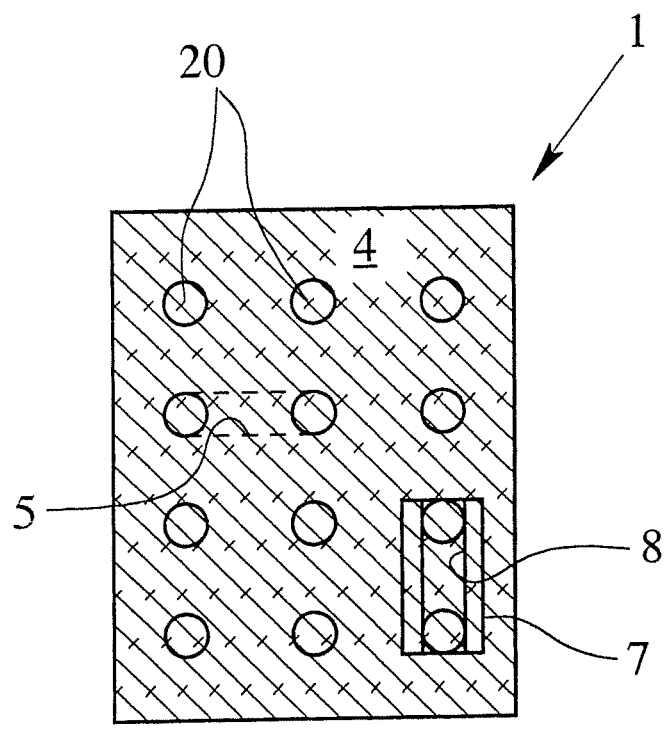
FIG. 19 is a schematic plan view of a proposed device according to a ninth embodiment.

The detachment of the laminated-on cover film 4 in certain areas 19 as explained above, and in particular, the defined three-dimensional shaping or doming thereof may also be used for other purposes. For example, it is a very simple method of producing all kinds of fluidic connections or networks, for example, for test purposes or other purposes. Alternatively or additionally, different structures can also be fluidically connected one after another. FIG. 19 shows, by way of example, a carrier 3 of the microtitre plate type with different fluidic wells, structures, channel openings or the like, which are generally designated 20. These structures 20 may if necessary be connected by correspondingly formable chambers 5. This is shown, by way of example, for two structures 20 which are joined together via the chamber 5 indicated by broken lines.

Figure 20:
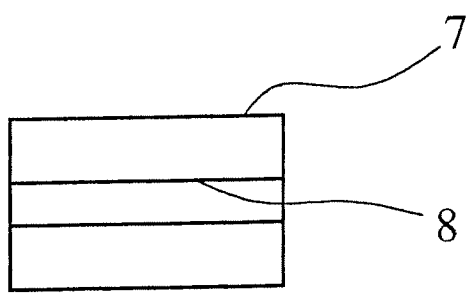
FIG. 20 is a bottom view of a mask or termode for the device according to FIG. 19.

By corresponding positioning of a corresponding termode or mask 7, as shown in FIG. 20 by way of example, it is possible to deliberately form, or suppress, only straight but optionally also curved, bent, angled or other preferably channel-like chambers 5 between the initially separate structures 20, for example. This is done, for example, by placing the mask 7 in the desired areas. It should also be noted that, as a result of the effect of heat and pressure in the adjacent regions, the cover film 4 is detached from the carrier 3 in the region of the recess or opening 8 in the mask 7, and accordingly, a fluidic connection can be made. FIG. 19 shows by way of example a possible arrangement of the mask 7 in the lower right-hand area, to enable two structures 20 to be joined together accordingly.

Figure 21:
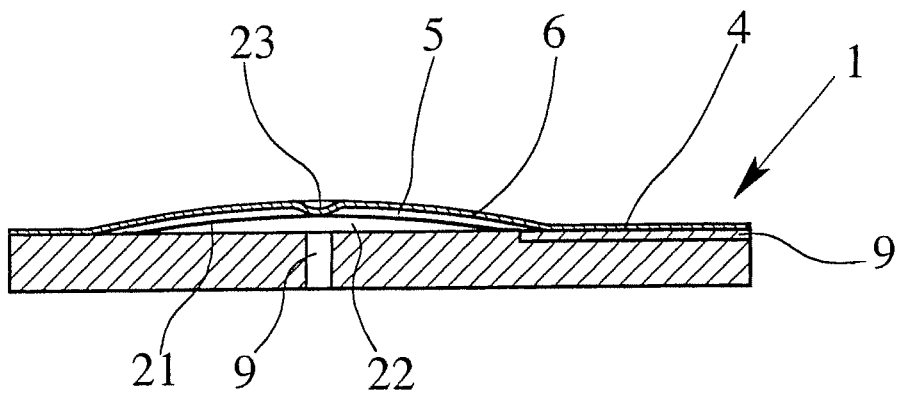
FIG. 21 a schematic section of a proposed device according to a tenth embodiment.

FIG. 21 shows, in schematic section, a tenth embodiment of the proposed device 1. The device 1 has a membrane 21 which is used, in particular, for separation purposes, for filtering or the like, e.g., for blood separation, particularly preferably for separating off blood plasma.

The membrane 21 is preferably arranged or secured on the carrier 3. The membrane 21 may be attached to the carrier 3 by any suitable method, i.e., by adhesion, welding, clamping and/or the like, in particular, by lamination.

The membrane 21 is at least partially, and in particular, completely covered by the cover film 4. The cover film 4 is connected to the carrier 3 and/or to the membrane 21, particularly in the edge region thereof, preferably by lamination as already described. The cover film 4 is preferably, in turn, made convex or three-dimensionally deformed so as to form the chamber 5 between the cover film 4 and the membrane 21.

The membrane 21 is, if necessary, domed in concave manner or away from the carrier 3. This can be done by means of suitable structures, support elements or the like and/or by corresponding preforming. Alternatively or additionally, the membrane 21 may also be deformed in this manner by the presence of a fluid pressure. Particularly preferably, a supply chamber 22 with the largest possible area is formed between the membrane 21 and the carrier 3 or on the side of the membrane 21 remote from the chamber 5.

Particularly preferably, the cover film 4 is connected to the membrane 21 centrally and/or in a region 23. This preferably takes place immediately during lamination, i.e., in particular, as a result of a corresponding design of the termode or mask 7, which is not shown here.

Figure 22:
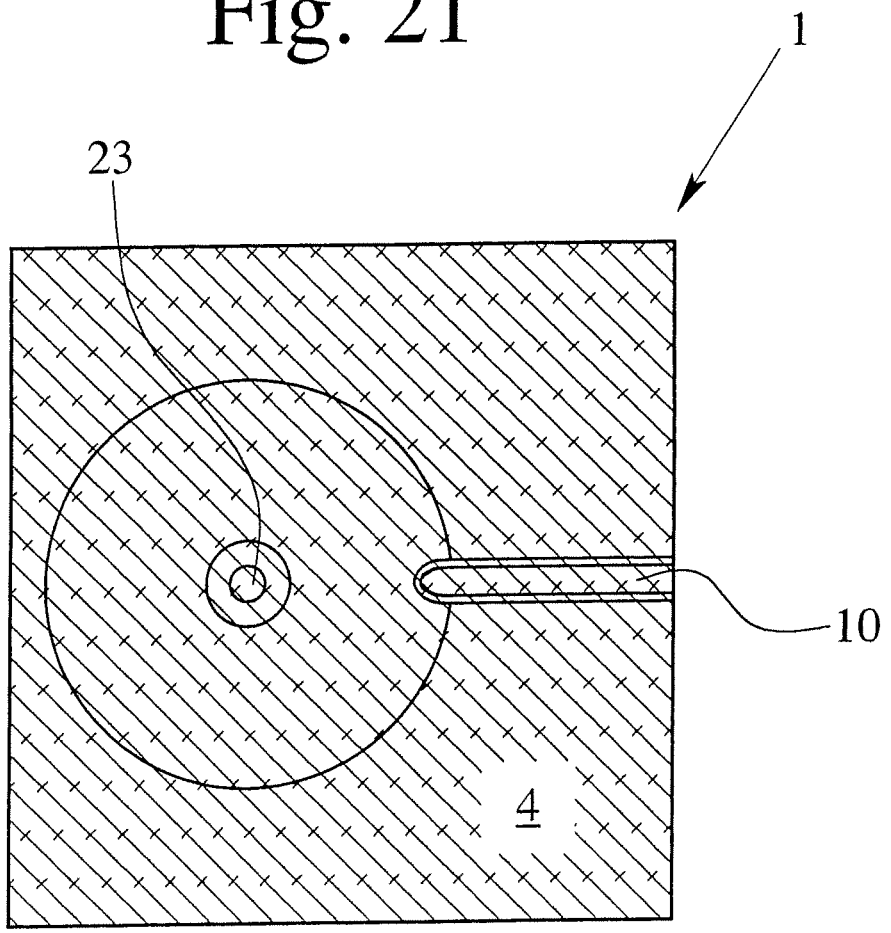
FIG. 22 is a plan view of the device according to FIG. 21.

FIG. 22 shows the preferred arrangement of the tenth embodiment in schematic plan view. In particular, it is apparent that the cover film 4 is connected to the membrane 21 in a region 23 where the supply chamber 22 is located on the opposite side or underside or on the side facing the carrier 3 and/or fluid is supplied through the first channel 9—in this case, through the carrier 3. However, another or different fluidic connection is also possible.

It is apparent from the plan view in FIG. 22 that the second channel 10 is preferably fluidically connected to the chamber 5 formed between the membrane 21 and the cover film 4.

When a fluid, e.g., blood, is supplied to the supply chamber 22, the permeate flowing or passing through the membrane 21, particularly blood plasma, is received by the chamber 5 and carried away through the second channel 10. Because of the particularly preferred central connection of the cover film 4 to the membrane 21, particularly high capillarity is achieved in the adjoining annular region of the chamber 5 or chamber wall 6. This contributes greatly to the filtering of fluid or separation of the blood, as has been demonstrated by tests. However, alternatively or in addition to achieving high capillarity in the chamber 5, it is also possible to bring the cover film 4 or chamber 6 close to the membrane 21 in some other way—particularly in the center—in particular, to place it thereon—for example, by pressing or holding it from outside or by some other suitable method.

The cover film 4 is preferably laminated onto the carrier 3 and particularly onto the membrane 21 in the central region as already described, forming the desired hollow structure or the chamber 5. However, other methods of application are also possible.

Figure 23:
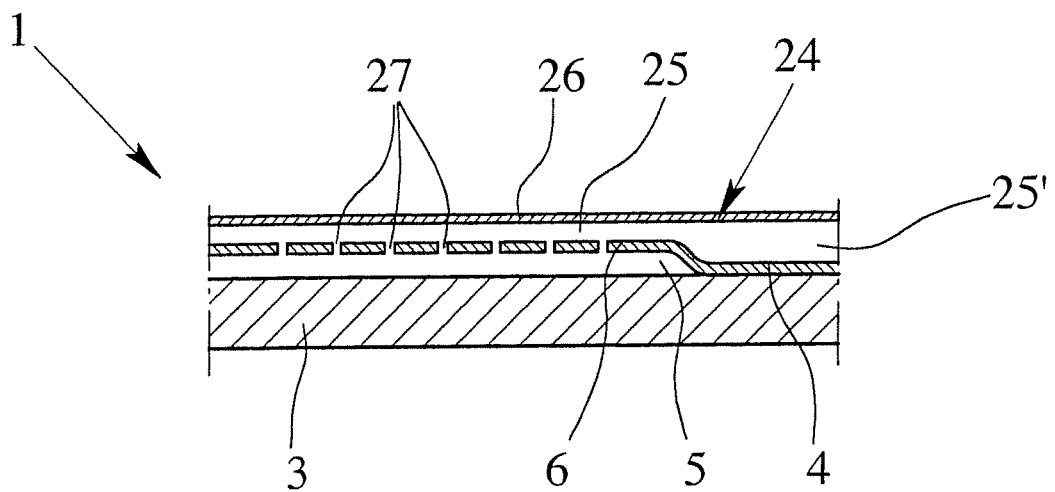
FIG. 23 is a schematic section of a proposed device according to an eleventh embodiment.

FIG. 23 shows in schematic section an eleventh embodiment of the proposed device 1. An additional film 24 is at least partially laminated onto the preferably laminated-on cover film 4 in the region of the chamber 5 formed by the cover film 4, thus forming an additional chamber 25, particularly in the region of the chamber 5 and/or above the cover film 4.

The additional chamber 25 is arranged, in particular, above and/or on a flat side of the chamber 5. However, other configurations and arrangements are also possible.

The additional film 24, purely by the process of being laminated on, preferably forms a three-dimensionally shaped or domed additional wall 26 which at least partially delimits the additional chamber 25, as schematically shown in FIG. 23. However, it is noted that the additional film 24 can be applied by any other suitable method. Accordingly, the three-dimensional shaping or doming of the additional film 24 or chamber wall 26 may be achieved selectively either directly by the lamination process and/or by some other method, e.g., by piping in pressurized gas, forming non-communicating areas or the like. The same applies to the cover film 24 and the chamber 5 thus formed.

The additional chamber 25 may, if required, extend only substantially in the region of the chamber 5 over the cover film 4. Preferably, however, the additional chamber 25 extends laterally beyond the chamber 5 at least on one side or in one region and then forms, for example, a somewhat thickened additional chamber region 25', as shown on the right in FIG. 23. This part 25' of the additional chamber 25 may be connected, for example, to a channel 10 (not shown) or the like. The chamber 5 may in turn be connected, for example, to a channel 9 (not shown) or the like.

The chambers 5, 25 arranged one above the other may be used for all kinds of purposes. For example, when the additional chamber 25 is pressed in by means of an element 13 (as shown for the other embodiments) or the like, so that only a flow in the additional chamber 25 is throttled or prevented. Depending on the prevailing pressure conditions, the dimensions of the chamber, the dimensions of the films 4, 24 and other parameters, a flow through the chamber 5 can be throttled or even stopped at the same time, initially or only later. The same applies in reverse when the chambers 5, 25 are opened or released.

Moreover, by means of a common element 13, separate liquids in the preferably fluidically separate chambers 5, 25 may also be mixed at the same time.

In the embodiment shown, fluidic connections 27 to the additional chamber 25 are optionally provided in the region of the chamber wall 6. These connections 27 may be formed, for example, by corresponding pores, recesses, bores, holes or the like. If desired, only a single connection 27 may be provided.

The fluidic connections 27 may form a capillary stop—particularly where there is a very small diameter or cross-section—so that, for example, liquid can only flow out of the chamber 5 into the additional chamber 25 when the fluid pressure in the chamber 5 is greatly increased or when the chamber wall 26 is at least temporarily deformed so that it is brought much closer to the chamber wall 6 or even touches it—particularly, in the region of a connection 27. In this case, a region of very high capillarity is thus also formed, so that the capillary stop can be overcome and liquid can flow out of the chamber 5 into the additional chamber 25.

Figure 24:
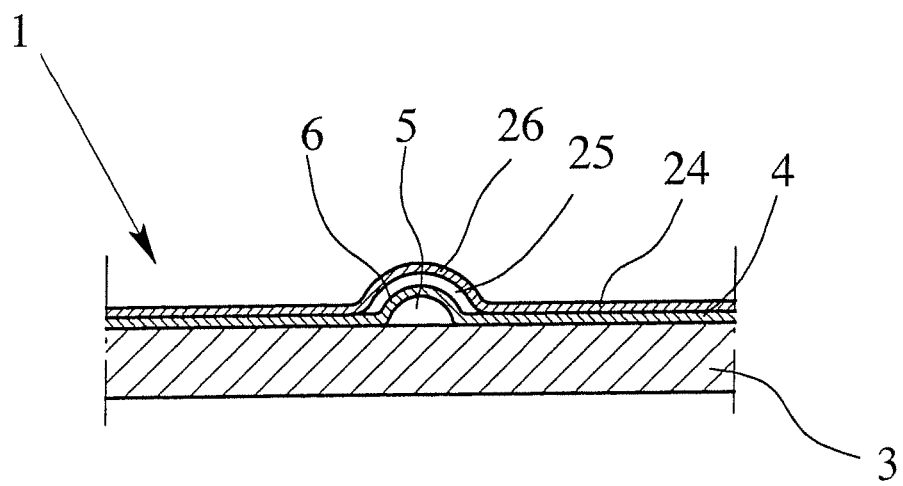
FIG. 24 is a schematic section of a proposed device according to a twelfth embodiment.

FIG. 24 shows, in schematic section, a twelfth embodiment of the proposed device 1.

The twelfth embodiment is very similar to the eleventh embodiment. The chamber 5 here forms, in particular, an at least substantially elongate channel. The additional film 24 preferably laminated over it forms the additional chamber 25, in particular, over it or along the chamber 5. This surrounds the chamber 5 particularly preferably substantially hemi-cylindrically and/or is arranged coaxially with the chamber 5. When different liquids or other fluids are conveyed through the chamber 5 and the additional chamber 25, hydrodynamic focusing is possible, in particular, in an adjoining common channel (not shown). However, the configuration according to FIG. 24 may also be used for other purposes.

Generally, the different embodiments may be combined with one another as desired. Moreover, individual aspects and features of the different embodiments may also be combined with one another as desired and/or used in other, similar devices and processes, particularly, in microfluidics.

What is claimed is:

1. Process for producing a device, comprising the step of laminating a flat, unstructured cover film onto a carrier by pressing a mask with at least one recess or opening onto the cover film under a melting action with heat, so that exclusively as a result of the lamination, the cover film in the region of the at least one recess or opening is not connected to the carrier, and detaching the laminated cover film from the carrier by pressing on the mask under the effect of heat in the region of the recess or opening of the mask in a manner producing a three-dimensionally deformed or structured shape in the laminated cover film that extends away from the carrier and is self-sustaining requiring pressure to collapse the three-dimensionally deformed or structured shape toward the carrier.

2. Process according to claim 1, wherein the mask is flat or plate-shaped.

3. Process according to claim 1, comprising the further step of at least partially covering the cover film with an additional film in the region of the chamber, while forming an additional chamber between the cover film and the additional film.

4. Process according to claim 1, wherein the cover film is laminated onto the carrier by means of a roller laminator with the mask.

5. Process according to claim 1, wherein the cover film is laminated onto the carrier by means of a punch laminator with the mask.

6. Process according to claim 1, wherein the cover film is a heat-sealing film.

7. Process according to claim 6, wherein the heat sealing film comprises a coating of sealing lacquer.

8. Process according to claim 3, wherein the covering step comprises covering of at least one fluidic structure of the carrier in the nature of a recess, depression, opening, groove or channel.

9. Process according to claim 1, wherein the cover film forms an elastically deformable chamber wall.

10. Process according to claim 1, wherein a chamber is formed between the carrier and the cover film.

11. Process according to claim 10, wherein the chamber has a channel-shaped, elongate or bead shaped construction in which the chamber wall is curved at right angles to a longitudinal extent of the chamber.

12. Process according to claim 3, wherein the covering step comprises covering and fluidically connecting fluidic structures on the carrier to a chamber formed between the carrier and the cover film.

13. Process according to claim 1, wherein the cover film is domed away from the carrier and forms a deformable pump chamber.

14. Process according to claim 1, wherein the carrier is of rigid or flexible or film-like construction.

15. Process according to claim 1, wherein the carrier is of plate-shaped, flat and/or planar construction.

16. Process according to claim 1, wherein the cover film is covered by an additional film in the region of a chamber, while between the cover film and the additional film an additional chamber is formed.

17. Process according to claim 1, wherein the mask is flat and/or plate-shaped.

18. Process according to claim 1, wherein the device is used for pumping, mixing or separating or as a valve or throttle.

19. Process according to claim 10, wherein the chamber opens automatically.

20. Process according to claim 10, wherein the chamber opens independently from pressure to fluid in the chamber.

21. Process for producing a device, comprising the step of:
laminating a flat, unstructured heat-sealing film onto a flat rigid carrier using a mask with at least one recess or opening by pressing the mask pressed onto the heat-sealing film causing a melting action with heat, so that exclusively as a result of the lamination process, the heat-sealing film is disconnected from the carrier in a region of the recess or opening and wherein the laminated cover film is detached from the carrier by pressing on the mask under the effect of heat in the region of the recess or opening of the mask, so that the laminated cover film is domed away from the carrier in a manner producing a three-dimensionally deformed shape in the laminated cover film that is self-sustaining in the absence of pressure acting to collapse the three-dimensionally deformed or structured shape toward the carrier.

22. Process according to claim 21, wherein the mask is flat or plate-shaped.

23. Process according to claim 21, wherein the heat sealing film comprises a coating of sealing lacquer.

24. Process according to claim 21, wherein the carrier is formed of a rigid or flexible film.

25. Process according to claim 21, wherein the carrier is formed of a plate-shaped, flat or planar construction.

26. Process according to claim 21, wherein the mask is flat or plate-shaped.

* * * * *